(12) United States Patent
Ragone et al.

(10) Patent No.: US 7,532,061 B2
(45) Date of Patent: May 12, 2009

(54) CHARGE-PUMP TYPE, VOLTAGE-BOOSTING DEVICE WITH REDUCED RIPPLE, IN PARTICULAR FOR NON-VOLATILE FLASH MEMORIES

(76) Inventors: Giancarlo Ragone, Vico III Micare, 43, Roccella Jonica (IT) 89047; Miriam Sangalli, Via XXV Aprile, 11D, Carugate (IT) 20061; Luca Crippa, Via Manzoni, 66, Busnago (IT) 20040; Rino Micheloni, Via Luini, 11, Turate (IT) 22078

( * ) Notice: Subject to any disclaimer, the term of this patent is extended or adjusted under 35 U.S.C. 154(b) by 105 days.

(21) Appl. No.: 11/437,268

(22) Filed: May 19, 2006

(65) Prior Publication Data
US 2007/0069801 A1   Mar. 29, 2007

(30) Foreign Application Priority Data
May 20, 2005   (EP)   ................... 05425348

(51) Int. Cl.
*G05F 1/10*   (2006.01)
*G05F 3/02*   (2006.01)
(52) U.S. Cl. ..................................... 327/536
(58) Field of Classification Search ................ 327/536; 363/59–60
See application file for complete search history.

(56) References Cited

U.S. PATENT DOCUMENTS

| | | | |
|---|---|---|---|
| 5,563,779 A * | 10/1996 | Cave et al. | 363/59 |
| 5,717,581 A | 2/1998 | Canclini | 363/60 |
| 6,486,728 B2 | 11/2002 | Kleveland | 327/536 |
| 6,525,595 B2 * | 2/2003 | Oku | 327/536 |
| 6,791,212 B2 * | 9/2004 | Pulvirenti et al. | 307/113 |
| 7,042,275 B2 * | 5/2006 | Suwa et al. | 327/536 |
| 2002/0003448 A1 | 1/2002 | Deml et al. | 327/536 |

FOREIGN PATENT DOCUMENTS

| | | |
|---|---|---|
| EP | 0808014 | 11/1997 |
| EP | 1298777 | 4/2003 |
| JP | 64001472 A  * | 1/1989 |
| JP | 2004005773 A  * | 1/2004 |

OTHER PUBLICATIONS

Pierre Favrat et al., "A High-Efficiency CMOS Voltage Doubler," *IEEE Journal of Solid-State Circuits*, vol. 33, No. 3, Mar. 1998, pp. 410-416.

* cited by examiner

*Primary Examiner*—Quan Tra
(74) *Attorney, Agent, or Firm*—Schwabe Williamson & Wyatt

(57) ABSTRACT

Voltage-boosting device having a supply input receiving a supply voltage, and a high-voltage output. The device is formed by a plurality of charge-pump stages series-connected between the supply input and the high-voltage output. Each charge-pump stage has a respective enabling input receiving an enabling signal. A control circuit formed by a plurality of comparators is connected to the high-voltage output and generates the enabling signals on the basis of the comparison between the voltage on the high-voltage output and a plurality of reference voltages, one for each comparator. The charge-pump stages are grouped into sets of stages, and the stages belonging to a same set receive a same enabling signal; thus, as many comparators as there are sets of stages are present.

17 Claims, 5 Drawing Sheets

US 7,532,061 B2

CHARGE-PUMP TYPE, VOLTAGE-BOOSTING DEVICE WITH REDUCED RIPPLE, IN PARTICULAR FOR NON-VOLATILE FLASH MEMORIES

BACKGROUND OF THE INVENTION

1. Field of the Invention

The present invention refers to a charge-pump type, voltage-boosting device with reduced ripple, in particular for non-volatile flash memories.

2. Description of the Related Art

As is known, in non-volatile flash memories the part of design that concerns charge pumps plays a fundamental role. In fact, these devices are necessary in the various operating steps of the memory (programming, erasing, reading, verifying). The design step of a charge pump consists in determining the number of stages and in their sizing to obtain a maximum deliverable current as well as the desired output voltage Vout, which, in a per se known manner, in the case of positive charge pumps is:

$$V\text{out}=Vdd*(n+1),$$

where Vdd is the supply voltage and n is the number of stages of the charge pump.

Normally, a flash memory has a supply voltage that varies within a given range, defined by the specifications. Consequently, in current memories, a system is provided for ON/OFF regulation of the output voltage, wherein a portion of the output voltage Vout is compared with a fixed reference voltage value. When the output voltage Vout exceeds the fixed reference voltage, no more clock pulses are sent to the pump, thus bringing about the pump arrest. As soon as the output voltage Vout drops below the desired value, the pump is started again.

The output voltage Vout obtained with the regulation method described has a ripple, which, in the case of pumps formed by the series-connection of many stages, can even arrive at some volts peak-to-peak, altering the control on the voltage to be regulated. For particular applications, such as multilevel flash memories, this represents a problem, since the correct operation of the memory (in reading, programming, and verifying) requires a sufficient precision of the supply. Furthermore, if the charge pump supplies a voltage regulator of a linear type, this must have a high power-supply rejection ratio (PSRR).

Charge pumps are known formed by a plurality of stages series-connected, which can be differently controlled according to the operating conditions. For example, U.S. Pat. No. 6,486,728 describes a multistage charge pump wherein an operational amplifier compares a portion of the output voltage with a reference voltage, and its output controls the frequency of an oscillator that generates the clock signal supplied to the stages. Furthermore, a programmed logic enables turning-on of only some of the stages.

U.S. Pat. No. 5,717,581 describes a multistage charge pump equipped with a feedback control circuit that controls conductivity of the switches included in the stages.

US-A-2002/0003448 describes a structure that is able to adapt the number of stages to be inserted according to the current and the output voltage to improve efficiency as regards consumption levels. To this end, the current and/or voltage output signal, after being converted into digital form, is supplied to a up-counter or down-counter, which, through a counting operation, determines activation or deactivation of the individual stages of the pump.

These systems do not tackle the problem of reducing the output ripple; moreover they are suited only for specific types of charge pumps and hence are not of general application.

BRIEF SUMMARY OF THE INVENTION

One embodiment of the invention is thus to provide a charge-pump voltage-boosting device that overcomes the disadvantages of the known solutions.

One embodiment of the present invention provides a charge-pump voltage-boosting device that includes a supply input receiving a supply voltage; a high-voltage output; a plurality of charge-pump stages series-connected between the supply input and the high-voltage output, each charge-pump stage having a respective enabling input receiving a respective one of plural enabling signals; and a control circuit connected to the high-voltage output and generating the enabling signals. The control circuit includes a plurality of comparators connected to the high-voltage output. Each of the comparators receives a respective one of a plurality of reference voltages and generates a respective one of the enabling signals for the charge-pump stages. The charge-pump stages form sets of stages, each set of stages being connected respectively to a respective comparator of the comparators. As a result, the charge-pump stages of the set of stages are coupled to a same one of the enabling signals.

BRIEF DESCRIPTION OF THE SEVERAL VIEWS OF THE DRAWING(S)

For an understanding of the present invention, a preferred embodiment thereof is now described purely by way of non-limiting example, with reference to the attached drawings, wherein.

DETAILED DESCRIPTION OF THE INVENTION

Figure 1:
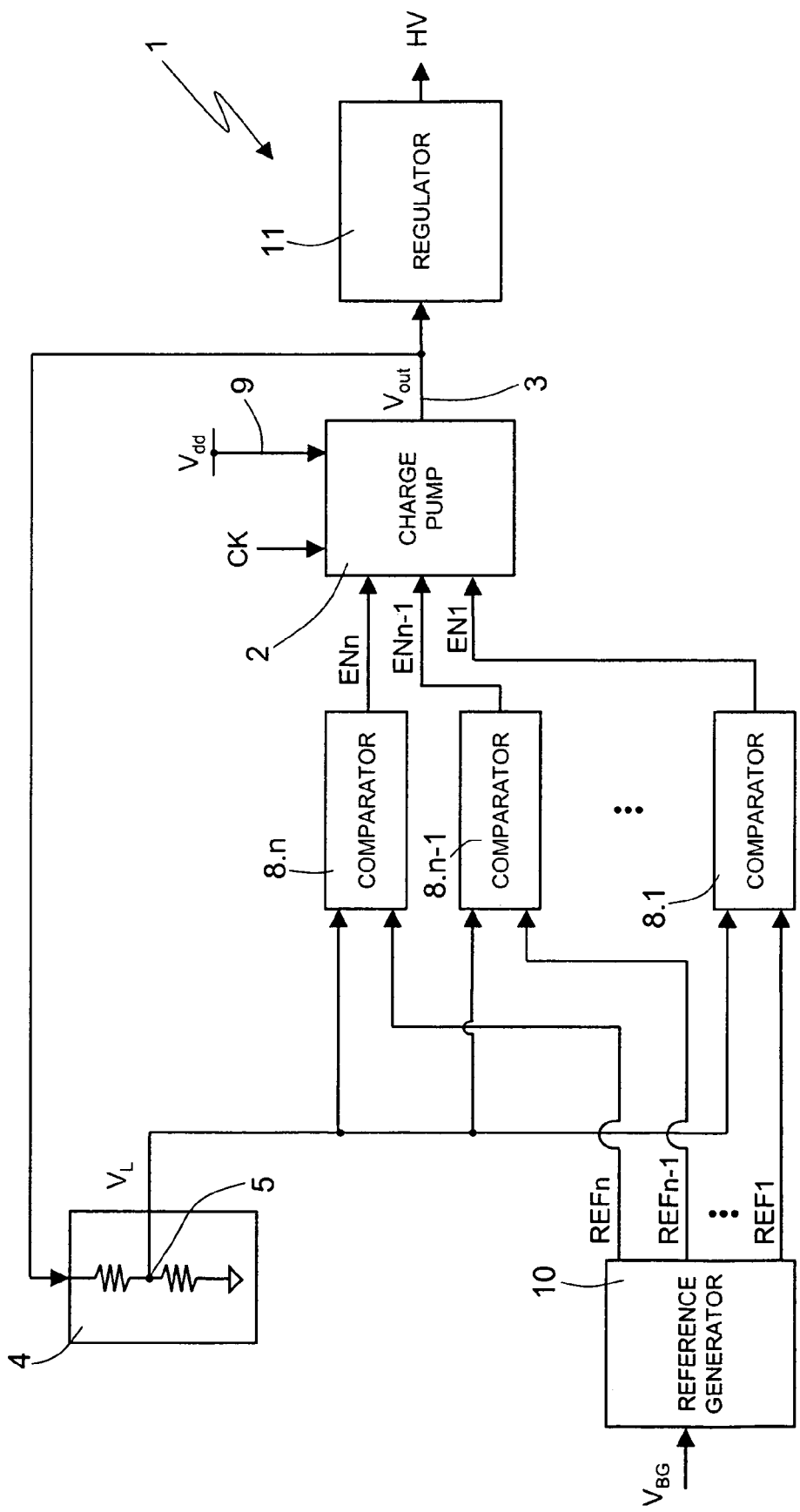
FIG. 1 shows a block diagram of a voltage-boosting device according to the invention.

FIG. 1 shows a voltage-boosting device 1 comprising a charge-pump circuit 2 having an output 3 providing an output voltage Vout, set at a high value. The output 3 is connected to a resistive divider 4 having an intermediate tap 5, which supplies a divided voltage $V_L$ and is connected to a first input of a plurality of comparators 8.1, ..., 8.$n$−1, 8.$n$. In the embodiment illustrated in FIG. 1, the output voltage Vout of the voltage-boosting device 1 is supplied also to a regulator 11, for example of a linear type.

A second input of the comparators 8.1, ..., 8.$n$ is connected to a respective output of a reference generator 10 and receives a respective reference voltage REF1, ..., REFn−1, REFn. The reference generator 10 receives a compensated voltage $V_{BG}$, for example generated by a voltage generator of a bandgap type, and is formed, for example, by a voltage divider.

The comparators 8.1, ..., 8.n carry out the comparison between the divided voltage $V_L$ and the respective reference voltage REF1, ..., REFn and generate a respective enabling signal EN1, ..., ENn−1, ENn supplied to the charge-pump circuit 2.

The charge-pump circuit 2 is formed by a plurality of stages series-connected between an input 9, which receives a supply voltage Vdd, and the output 3. The stages are divided into sets, each of which receives an own enabling signal EN1, ..., ENn−1, Enn, as described in greater detail with reference to FIGS. 2 and 3, in the case of two sets of stages and of n sets of stages, respectively. In practice, as many comparators are present as sets of stages.

In particular, assuming that the first set of stages, which receives the enabling signal EN1, is the one upstream (closest to the input 9 of the charge-pump circuit 2) and that the last set of stages, which receives the enabling signal ENn, is the one downstream (closest to the output 3 of the charge-pump circuit 2), the reference voltages are generated so that REF1< ... <REFn−1<REFn.

In the device of FIG. 1, when the divided voltage $V_L$ drops below the reference voltage REFn, the comparator 8.n is triggered, activating the last set of stages. When the divided voltage $V_L$ drops below the reference voltage REFn−1, the comparator 8.n−1 is triggered, activating the last-but-one set of stages, and so forth up to the first set of stages 8.1. Instead, as the divided voltage $V_L$ increases, the sets of stages starting from the first to the last are gradually deactivated.

Figure 2:
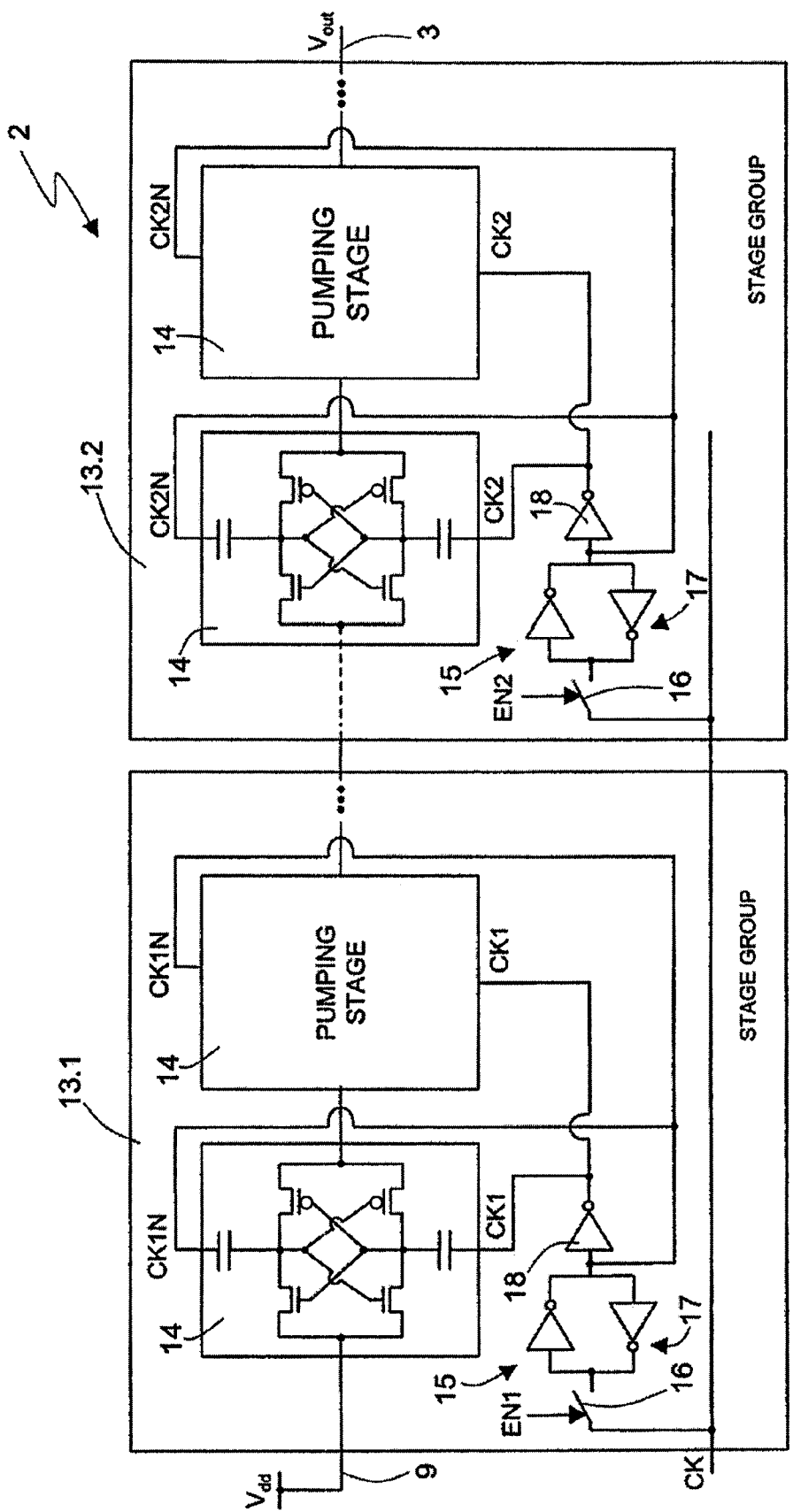
FIG. 2 shows the circuit diagram of a first embodiment of a block of FIG. 1.

FIG. 2 shows an embodiment of a charge-pump circuit 2 equipped with two sets of stages 13.1, 13.2, series-connected and each formed by a plurality of stages 14, which are also series-connected.

Each stage 14 can be made in any way. For example, FIG. 2 illustrates the structure described in P. Gavrat, P. Deval, M. J. Declercq, "A High-Efficiency CMOS Voltage Doubler", IEEE Journal of Solid-State Circuits, Vol. 33, No. 3, March 1998; other solutions are, however, also possible.

In the embodiment illustrated, the stage 14 furthest upstream of the set of stages 13.1 is connected to the input 9 and receives the supply voltage Vdd. In addition, the output of the last stage 14 of the set of stages 13.2 forms the output 3 of the charge-pump circuit 2.

The stages 14 of each set of stages 13.1, 13.2 receive the same clock signals CK1, CK1N, CK2, CK2N generated by a respective enabling circuit 15 formed by a switch 16, a latch 17, and an inverter 18. In detail, each switch 16 has a first terminal which receives a clock signal CK, a second terminal connected to the respective latch 17, and a control terminal which receives an own enabling signal EN1, EN2. Each inverter 18 is connected to the output of the respective latch 17, so that the clock signals CK1, CK1N and CK2, CK2N, necessary for timing the stages 14, are present on the input and on the output of each inverter 18.

In practice, when the enabling signals EN1, EN2 are at a first logic level (for example "1"), they close the respective switch 16 and enable periodic switching of the respective clock signals CK1, CK1N and CK2, CK2N according to the frequency of the clock signal CK, thus enabling the respective stages 14. Instead, when the enabling signals EN1, EN2 are at a second logic level (for example "0"), they open the respective switch 16 and interrupt switching of the respective clock signals CK1, CK1N, and CK2, CK2N, thus disabling the respective stages 14.

Figure 4:
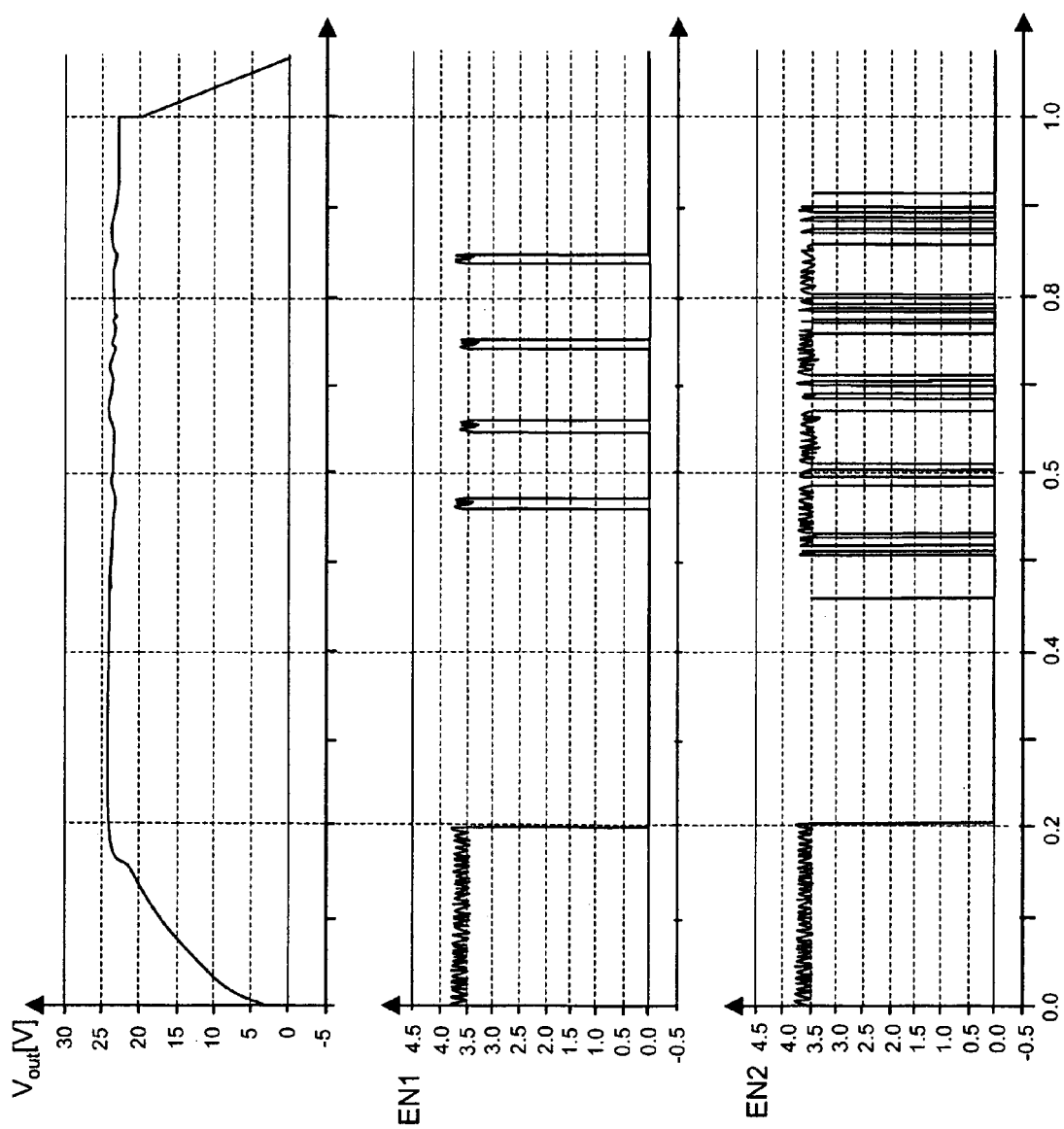
FIG. 4 shows the plot of some electrical quantities in the circuit of FIG. 2.

In this way, when in the voltage-boosting device 1 of FIG. 1 the divided voltage $V_L$ drops below the reference voltage REF2 and the comparator 8.2 is triggered, the enabling signal EN2 closes the respective switch 16 and simultaneously activates all the stages of the second set of stages 13.2. When the divided voltage $V_L$ drops below the reference voltage REF1 and the comparator 8.1 is triggered, the enabling signal EN1 closes the respective switch 16 and simultaneously activates all the stages of the first set of stages 13.1. Instead, as the divided voltage $V_L$ increases, the set of stages 13.1 is first deactivated, and then the set of stages 13.2. This behavior is evident from the plots of the output voltage Vout and of the clock signals CK1 and CK2 illustrated in FIGS. 4 and 6, corresponding to simulations performed for a voltage-boosting device 1 formed by eleven equal stages, with the control modulated in the way described with reference to FIG. 2. In particular, in the simulation, the first set of stages 13.1 comprises eight stages, and the second set of stages 13.2 comprises three stages, assuming a supply voltage Vdd of 3.6 V with a load current of 300 µA.

In practice, the stages 14 of the second set of stages 13.2 are activated for maintaining the output voltage Vout equal to a desired value in case of non-excessive load, while the stages 14 of the first set of stages 13.1 are activated only when the voltage drops further.

Figure 5:
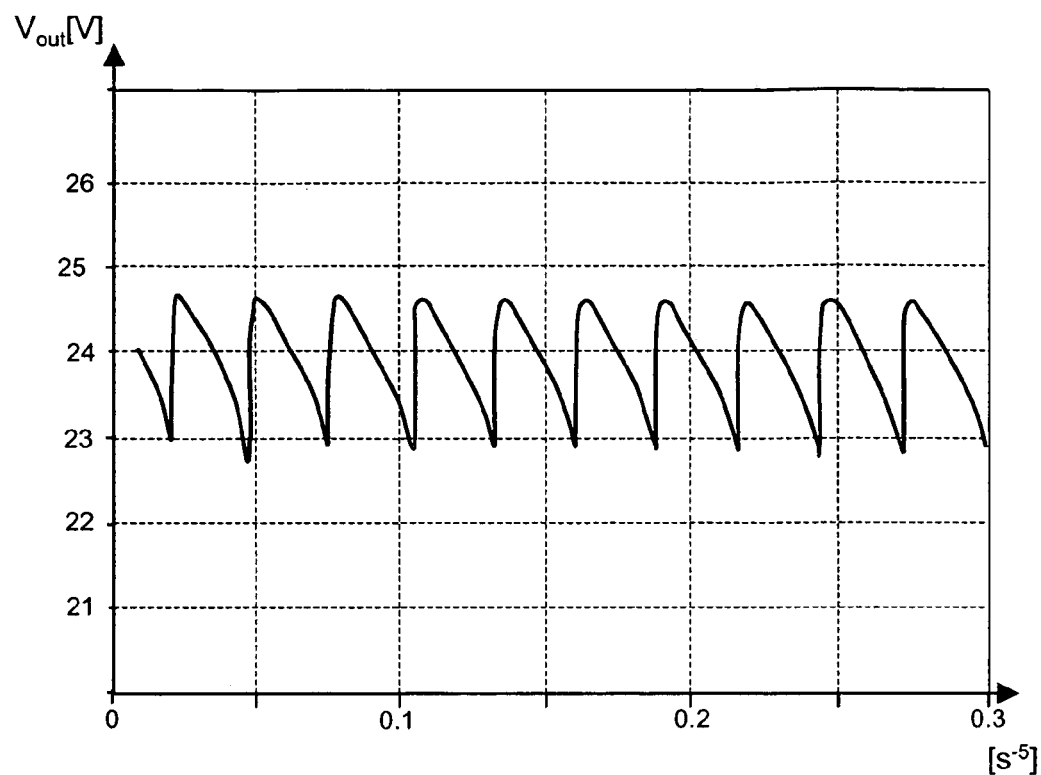
FIGS. 5 and 6 show an enlarged detail of an electrical quantity of FIG. 4, respectively in the case of a known voltage-boosting device and one according to the invention.
Figure 6:
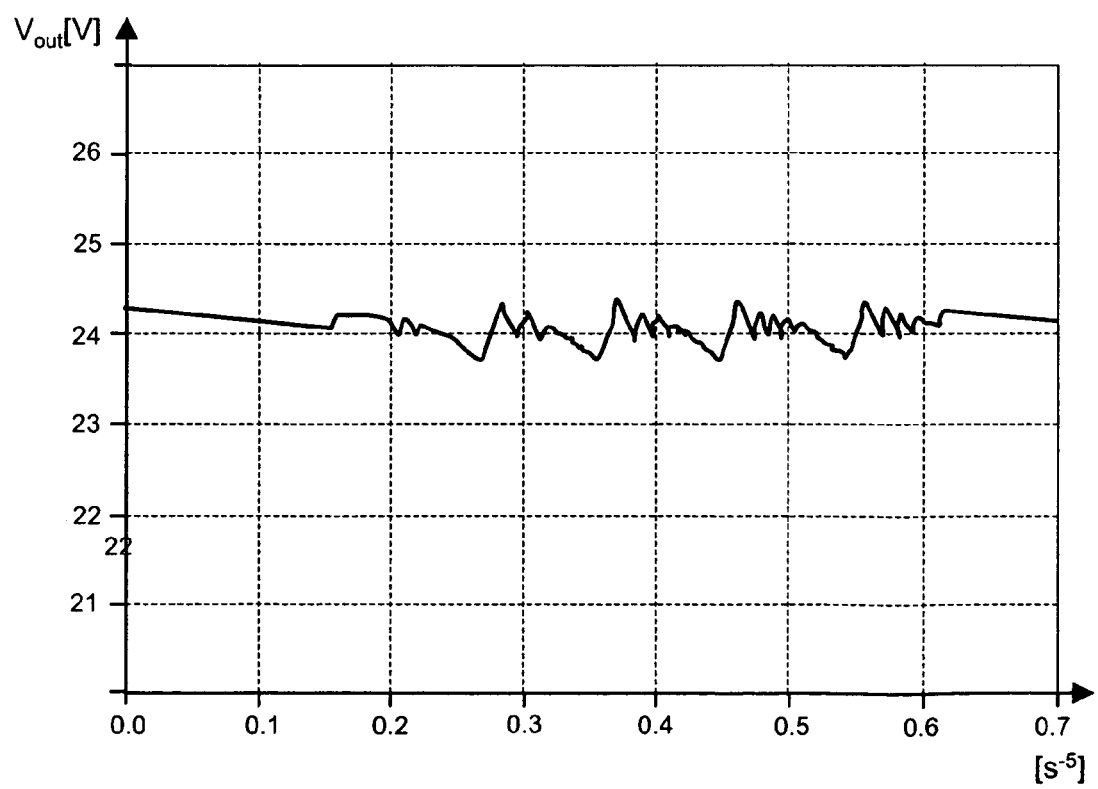

As may be noted in particular from the comparison of FIGS. 5 and 6, corresponding to an enlargement of the plot of the output voltage Vout in the case of voltage-boosting devices according to the same hypotheses made above (eleven equal stages, Vdd=3.6 V and Iout=300 µA), corresponding to a standard ON/OFF control (FIG. 5) and to the circuit of FIG. 2 (FIG. 6), a considerable reduction in the ripple is achieved with the device of FIG. 2. In fact, the known device has a ripple of 1.8 Vpp, while the device of FIG. 2 has a peak-to-peak ripple of approximately 600 mV, corresponding to a reduction of approximately 67%, with consequent improvement of the control of the value of the output voltage Vout.

Figure 3:
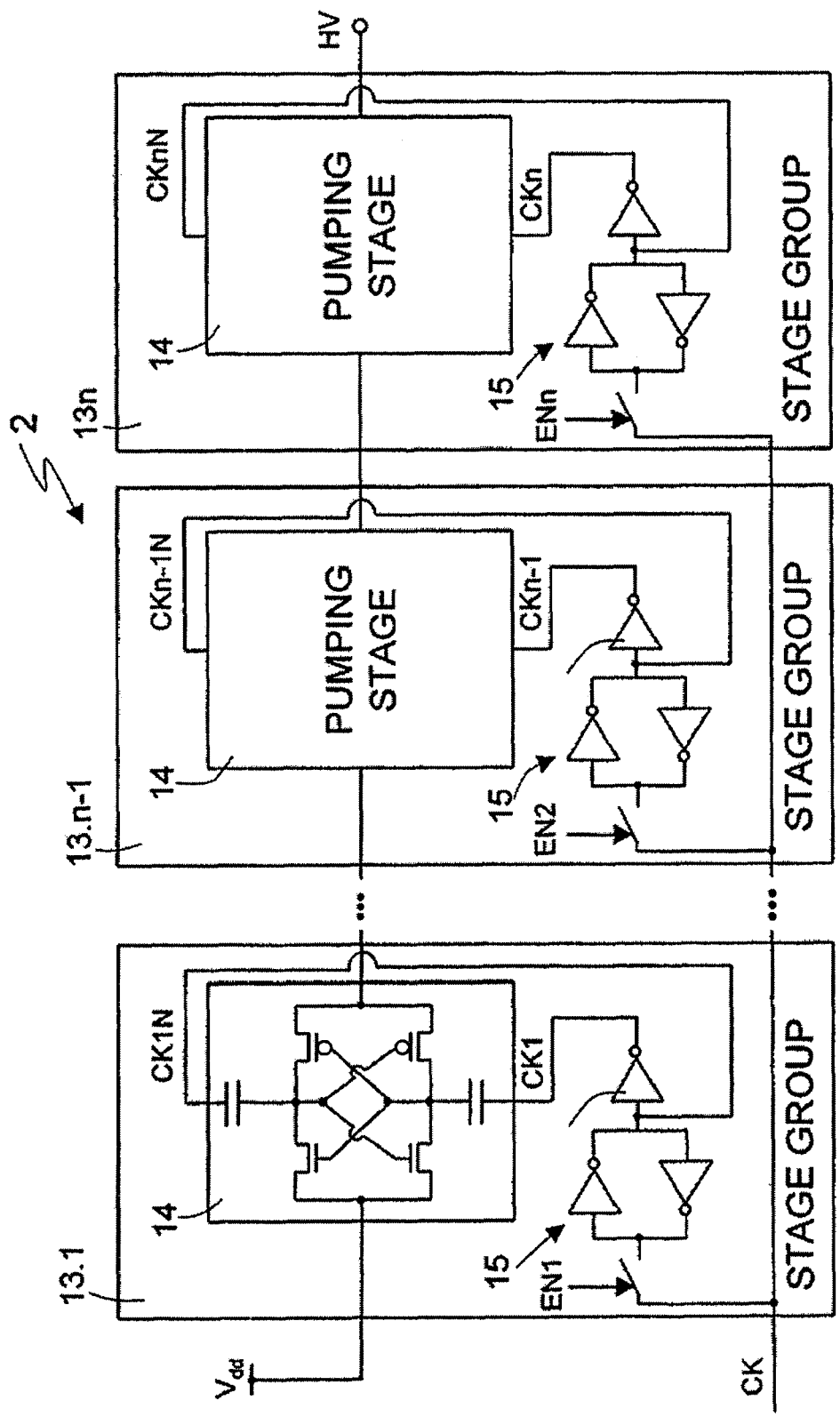
FIG. 3 shows the circuit diagram of a second embodiment of a block of FIG. 1.

FIG. 3 shows an embodiment of the voltage-boosting circuit 2, wherein n sets of stages 13.1, ..., 13.n−1, 13.n are present, each formed by just one stage 14 or by a plurality of stages 14 series-connected. Each set of stages 13 is activated by respective clock signals CK1, CK1N, ..., CKn−1, CKn−1N, CKn, CKnN, generated by respective enabling circuits 15, made as described with reference to FIG. 2. Operation of the voltage-boosting circuit 2 of FIG. 3 is therefore similar to what has already been described and thus does not call for any further description.

From the above, it is evident that the possibility of activating/deactivating sets of stages independently of one another on the basis of the output voltage enables a considerable reduction in the ripple on the output voltage itself, by means of a simple and reliable solution, readily integrable within a memory.

Finally, it is clear that numerous modifications and variations can be made to the voltage-boosting device described and illustrated herein, all falling within the scope of the invention, as defined in the attached claims. In particular, it is emphasized that the number of sets of stages, as likewise the number of stages of each set, can be chosen at will, on the basis of the characteristics required. In addition, the sets of stages can comprise different numbers of stages, as in the simulation described above. Furthermore, the stages can be implemented according to any type suited to the application envisaged.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The invention claimed is:

1. A voltage-boosting device, comprising:
    a supply input configured to receive a supply voltage;
    a high-voltage output configured to output an output voltage;
    a plurality of sets of charge-pump stages series-connected between said supply input and said high-voltage output, each set of charge-pump stages having a plurality of charge-pump stages and a respective enabling input receiving a respective one of plural enabling signals, such that the charge-pump stages of the set are coupled to, and controlled by, the same enabling signal, and each set of charge-pump stages is activated by the respective enabling signal independently of the other sets of the plurality of sets; and
    a control circuit coupled to said high-voltage output and configured to generate said enabling signals, said control circuit including a plurality of comparators coupled to said high-voltage output, each of the comparators receiving a respective one of a plurality of reference voltages, said comparators each configured to generate a respective one of the enabling signals for said sets of charge-pump stages, each set of charge-pump stages being coupled respectively to a respective comparator of the comparators;
    wherein each set of stages comprises:
        a respective enabling circuit including a timing input receiving a clock signal; and
        a switch element connected between said timing input and the charge-pump stages of the set, said switch element having a control input which receives the respective enabling signal for the set, such that when the switch element is activated by the respective enabling signal, the switch element supplies the clock signal to all of the charge-pump stages of the set; and
    wherein each enabling circuit comprises a latch arranged between said respective switch element and the charge-pump stages of the set that includes the enabling circuit.

2. The device of claim 1, wherein a first one of the sets of charge-pump stages comprises a first number of charge-pump stages and a second one of the sets of charge-pump stages comprises a second number of charge-pump stages that is different than the first number.

3. The device of claim 1, wherein said sets of stages comprise at least one output set connected to said high-voltage output and one input set, connected to said supply input, the comparator coupled to said input set receiving a divided voltage, having a value based on the output voltage, and a first reference voltage, and the comparator coupled to said output set receiving the divided voltage and a second reference voltage higher than said first reference voltage.

4. The device of claim 3, wherein said sets of stages comprise intermediate sets connected between said input set and said output set, the comparators coupled to said intermediate sets each receiving the divided voltage and respective increasing reference voltages, which are intermediate between said first and second reference voltages.

5. The device of claim 1, comprising a voltage divider connected between said high-voltage output and said comparators.

6. A method for voltage boosting, comprising:
    supplying a supply voltage to a voltage-boosting device that includes a plurality of series-connected sets of charge-pump stages, each set including a plurality of charge-pump stages;
    generating enabling signals for said sets of charge-pump stages based on an output voltage of said voltage-boosting device; said step of generating enabling signals including comparing said output voltage with a plurality of reference voltages, and generating said enabling signals based on outcomes of the comparisons;
    supplying the enabling signals to the sets, respectively, such that the charge-pump stages belonging to one of the sets of stages each respond to the same one of the enabling signals, and each set is activated independently of the other sets;
    selectively connecting a clock signal to the charge pump stages of the sets, respectively, based on the respective enable signal for the set; and
    latching the clock signal in each set that is enabled by the respective enabling signal.

7. The method of claim 6, further comprising controlling a ripple of the output voltage by selectively activating and deactivating the sets of charge-pump stage independently.

8. The method of claim 6, wherein the sets of stages comprise at least one output set connected to the high-voltage output and one input set, connected to the supply input, the comparing step including comparing the output voltage to a first reference voltage to produce the enabling signal for the input set, and comparing the output voltage to a second reference voltage, higher than the first reference voltage, to produce the enabling signal for the output set.

9. The method of claim 8, wherein the sets of stages comprise intermediate sets connected between the input set and the output set, the comparing step including comparing the output voltage to increasing reference voltages, which are intermediate between the first and second reference voltages to produce the enabling signals for the intermediate sets.

10. The method of claim 6, wherein the sets of stages comprise at least one output set connected to the high-voltage output and one input set, connected to the supply input, the comparing step including comparing the output voltage to a first reference voltage to produce the enabling signal for the input set, and comparing the output voltage to a second reference voltage, higher than the first reference voltage, to produce the enabling signal for the output set.

11. A voltage-boosting device, comprising;
    a supply input receiving a supply voltage;
    a high-voltage output;
    a control circuit structured to generate a plurality of enabling signals, the control circuit including a plurality of comparators connected to the high-voltage output, each of the comparators being structured to generate a respective one of the enabling signals based on a respective one of a plurality of reference voltages; and
    a plurality of sets of charge-pump stages series-connected between the supply input and the high-voltage output, each set of the plurality having plural charge-pump stages, a respective enabling input receiving a respective one of plural enabling signals, and a respective clock input connected to a clock signal, each charge-pump stage having a respective clock input that is selectively connected to the clock input of the set that includes the charge-pump stage,
    wherein each set of stages comprises: a respective enabling circuit including a timing input receiving a clock signal; and a switch element connected between the timing input and the charge-pump stages of the set, the switch element having a control input which receives the respective enabling signal for the set, and
    wherein each enabling circuit moreover comprises a latch arranged between the respective switch element and the charge-pump stages of the set that includes the enabling circuit.

12. The device of claim 11, further comprising a charge pump set that includes only one charge-pump stage that is selectively connected to one of the enabling signals.

13. The device of claim 11, wherein the sets of stages comprise at least one output set connected to the high-voltage output and one input set, connected to the supply input, the comparator connected to the input set receiving a divided voltage, having a value based on the output voltage, and a first reference voltage, and the comparator connected to the output set receiving the divided voltage and a second reference voltage higher than the first reference voltage.

14. The device of claim 13, wherein the sets of stages comprise intermediate sets connected between the input set and the output set, the comparators coupled to the intermediate sets receiving the divided voltage and respective increasing reference voltages, which are intermediate between the first and second reference voltages.

15. The device of claim 11, comprising a voltage divider connected between the high-voltage output and the comparators.

16. A method for voltage boosting through a voltage-boosting device comprising a plurality of series-connected charge-pump stages, comprising the steps of:

supplying a supply voltage to said voltage-boosting device;

generating enabling signals for said charge-pump stages based on an output voltage of said voltage-boosting device; said step of generating enabling signals including comparing said output voltage with a plurality of reference voltages, and generating said enabling signals based on outcomes of the comparisons, wherein said charge-pump stages form sets of stages;

supplying the enabling signals to the sets, respectively, such that the charge-pump stages belonging to one of the set of stages each respond to the same one of the enabling signals;

selectively connecting a clock signal to the charge pump stages of the sets, respectively, based on the respective enable signal for the set; and latching the clock signal in each set that is enabled by the respective enabling signal.

17. The method of claim 16, further comprising controlling a ripple of the output voltage by selectively activating and deactivating the sets of charge-pump stage independently.

* * * * *